United States Patent
Nakamura

(10) Patent No.: US 7,972,654 B2
(45) Date of Patent: Jul. 5, 2011

(54) PLANARIZING COATING METHOD

(75) Inventor: Akihiko Nakamura, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 908 days.

(21) Appl. No.: 11/937,266

(22) Filed: Nov. 8, 2007

(65) Prior Publication Data
US 2008/0254215 A1 Oct. 16, 2008

(30) Foreign Application Priority Data
Nov. 8, 2006 (JP) ................................. 2006-302181

(51) Int. Cl.
*B05D 3/12* (2006.01)
*B05D 1/38* (2006.01)

(52) U.S. Cl. ..... 427/240; 427/261; 427/265; 427/407.1; 427/419.3; 427/425; 438/758

(58) Field of Classification Search ................. 427/240, 427/425, 261, 265, 407.1, 419.3; 438/758
See application file for complete search history.

(56) References Cited

U.S. PATENT DOCUMENTS

| 4,576,834 A | * | 3/1986 | Sobczak | 438/431 |
| 6,214,104 B1 | * | 4/2001 | Iida et al. | 106/287.13 |
| 2005/0170093 A1 | | 8/2005 | Chung et al. | |

FOREIGN PATENT DOCUMENTS

JP 2003-230860 8/2003

* cited by examiner

*Primary Examiner* — Kirsten C Jolley
(74) *Attorney, Agent, or Firm* — Carrier Blackman & Associates, P.C.; Joseph P. Carrier; William D. Blackman

(57) ABSTRACT

A planarizing coating method for filling a step between patterns formed on a board surface, includes the steps of: preparing at least two types of coating liquids different in nonvolatile matter densities, first coating one of the coating liquids higher in density on the board surface, rotating the board so as to leave the one coating liquid inside the step and such that, at the same time, substantially none of the one coating liquid is left on a pattern crest of the patterns, subsequently coating another of the coating liquids lower in nonvolatile matter density on the board surface, and rotating the board so that the coating liquid lower in density is left on a coating film comprising the one coating liquid higher in density and such that, at the same time, substantially none of the other coating liquid lower in density left on the pattern crest.

14 Claims, 2 Drawing Sheets

PRIOR ART

PLANARIZING COATING METHOD

CROSS-REFERENCE TO RELATED APPLICATIONS

The present claims priority from Japanese patent application 2006-302181, filed 08 Nov. 2006. The entire disclosure of the referenced priority document is incorporated herein by reference.

BACKGROUND OF THE INVENTION

1. Field of the Invention

The present invention relates to a planarizing coating method that fills a step (gap) between wiring patterns formed on the board surface of a semiconductor wafer, a glass board, and the like on which the wiring pattern is formed.

2. Description of the Related Art

Heretofore, after filling the step between the wiring patterns formed on a semiconductor wafer surface by an insulating coating film (SOG: Spin-on Glass), an interlayer insulating film is formed on the step, and further on the step, a wiring process is performed, thereby forming a three-dimensional circuit. Here, to make the wiring process of the upper layer easy, it is indispensable to evenly form the interlayer insulating film, and various proposals for this purpose have been disclosed.

When the gap of the wiring patterns is filled by the insulating coating film, heretofore, the coating liquid of the same specification has been coated twice. However, according to this method, when an attempt is made to completely fill the gap of the wiring patterns, the coating liquid ends up being thickly adhered also on the pattern crest, and this has created a problem of the lack of flatness of the interlayer insulating film formed on the crest.

Such an example is shown in FIGS. 4A and 4B. On a board W, wiring patterns 100 are formed, and the gap between these patterns is made in the form of a step. The board W having this step is processed by the coating liquid so as to obtain a coating film 101 as shown in FIG. 4A. At this stage, the crest 100a of the wiring pattern 100 is hardly adhered with any coating film, nor is the step flattened.

Hence, to further fill up the step, when a second coating is performed and a coating film 102 is formed as shown in FIG. 4B, the crest 100a ends up being also adhered with a coating film of a considerable thickness. When the coating film adhered on the crest 100a is thick, the flatness of the interlayer insulating film formed on this film is also deteriorated, thereby causing difficulty in the formation of an integrated circuit.

Further, there has been practiced a method also, in which the step between the wiring patterns is filled up with sediment by an HDP (High Density Plasma), and the sediment on the wiring patterns is flattened by abrading by a CMP (Chemical Mechanical Polishing), and after that, the interlayer insulating film is formed by a plasma CVD (Chemical Vapor Deposition).

Further, Japanese Patent Laid-Open No. 2003-230860 (Patent Document 1) discloses a coating device to coat a plurality of liquids with viscosities different from one another on the board. Specifically, the coating by the liquids with viscosities different from one another is performed corresponding to the arrangement of the step between the wiring patterns, so that the steps of the board can be effectively removed.

According to the method, in which the step between the wiring patterns is filled up with the sediment by the HDP, and the sediment on the wiring patterns is abraded by the CMP so as to be flattened, and after that, the interlayer insulating film is formed by the plasma CVD, sufficient flatness can be obtained. However, the employment of the HDP and the CMP requires expensive equipment and the cost thereof is high, and this is not a simple method. In addition, there is a problem of the wasting and the like of raw materials due to a large consumption of energy by the employment of the HDP and the CMP and the abrading of the sediment.

Further, the coating device as disclosed in Japanese Patent Laid-Open No. 2003-230860 (Patent Document 1) is unable to effectively prevent a problem of the coating liquid thickly adhering on the pattern crest.

SUMMARY OF THE INVENTION

To solve the above described problems, according to a first aspect of the present invention there is provided a method for filling a step between wiring patterns formed on a board surface, comprising the steps of: preparing at least two type of coating liquids (for example, SOG and photo-resist) different in non-volatile matter densities, coating a first one of the coating liquids higher in non-volatile matter density on the pattern forming surface of a board, rotating the board so as to leave the one coating liquid inside the step between the wiring patterns and, at the same time, substantially none of the coating liquid left on a pattern crest of the wiring patterns, subsequently coating another of the coating liquids lower in density on the board surface, and rotating the board so that the other coating liquid low in density is left on a coating film formed of the one coating liquid higher in density left inside the step and, at the same time, substantially none of the other coating liquid is left on the pattern crest.

According to a second aspect of the invention, essentially the same steps are performed as in the first aspect of the invention, except that the coating liquid used first as a coating liquid has the lower non-volatile matter density (low density), and the coating liquid used as a subsequent coating liquid has the higher non-volatile matter density (high density).

For the rotation of the board, a coating device of a rotary type that uniformly diffuses the coating liquid by centrifugal force may be used. However, from among the coating devices of the rotary type, a coating device of a rotary cup type may be preferably used. According to the coating device of the rotary cup type, an eddy flow is hard to arise inside the cup, and moreover, the interior of the cup can be made into a vacuum space, and this allows the drying of the coating liquid to be performed within a short time.

As an example of a board taken as an object of the coating method of the present invention, a semiconductor wafer can be typically cited. However, the coating method can be also applied to other boards, including a glass board for color filter, in addition to the wafer. As for the coating liquid to be used, the conventionally known coating liquids such as SOG (solution including silica related non-organic or organic coating film forming component) and photo-resist coating liquid can be used.

In the method of the present invention, at least two types of coating liquids different in non-volatile matter density are used. These coating liquids different in non-volatile matter density means the coating liquids of two types or more in which the content of the coating film forming component and the component (non-volatile matter) left over in the coating film obtained by finally drying other additives added according to need, e.g., pigment, photosensitizing agent, filler, surface active agent or the like, is changed.

As a specific non-volatile matter density of the coating liquid, for example, when two types of SOG coating liquids are used, as a high density liquid, a coating liquid of 6 to 20 percent by mass, and further, a coating liquid of 9 to 15 percent by mass, and as a low density liquid, a coating liquid of 3 to 12 percent by mass, and further, a coating liquid of 4 to 9 percent by mass are preferably used.

Further, when the photo-resist coating liquid is used, as a high density liquid, a coating liquid of 30 to 70 percent by mass, and further, a coating liquid of 40 to 60 percent by mass, and as a low density liquid, a coating liquid of 10 to 40 percent by mass, and further, a coating liquid of 20 to 40 percent by mass are preferably used.

In the planarizing coating method of the present invention, no limit is imposed on the order in which the liquid high in non-volatile matter density and the liquid low in density are used, and the order in use can be decided according to need. For example, when the SOG is used in the manufacture of the general wiring board, most steps are filled up by the high density coating liquid, and the remaining recesses are preferably flattened by the low density coating liquid.

On the other hand, when a semiconductor requiring an ultra microfabrication such as MEMS (Micro Electro Mechanical System) and a wiring board for thick film are manufactured and photo-resist is used, it is recommend that a step corner portion is filled up with the low density coating liquid so that the air does not enter, and next, the flatness of the whole board is adjusted by the high density coating liquid.

Incidentally, though the step between the patterns formed on the board surface is usually 100 to 300 nm, the present invention is excellent in its effect even when the size of the step increases to the extent of 300 to 1000 nm, and preferably to the extent of 400 to 800 nm.

According to the planarizing coating method of the first aspect of the invention, most of the step is roughly filled up with the prior coating using the high density coating liquid, and flatness is attempted by the later coating using the low density coating liquid, and therefore, a fine adjustment can be made. As a result, a coating film adhered amount on the crest of the wiring pattern can be reduced to a large extent, and even when the polishing process of the crest is omitted, a sufficiently flat insulating film can be obtained.

Further, according to a planarizing coating method of the second aspect of the invention, the air is prevented from being left over inside the step by the prior coating using the low density coating liquid, and the planarization can be effected by the later coating using the coating liquid of high density. In this case, even when the high density coating liquid is used, since the step has been already filled up to a certain extent, a coating liquid amount to be used is decreased, and the coating liquid adhered amount on the wiring pattern crest is also decreased.

DETAILED DESCRIPTION OF THE PREFERRED EMBODIMENTS

A planarizing coating method according to the present invention to be applied to a general wiring board will be described below.

Figure 1:
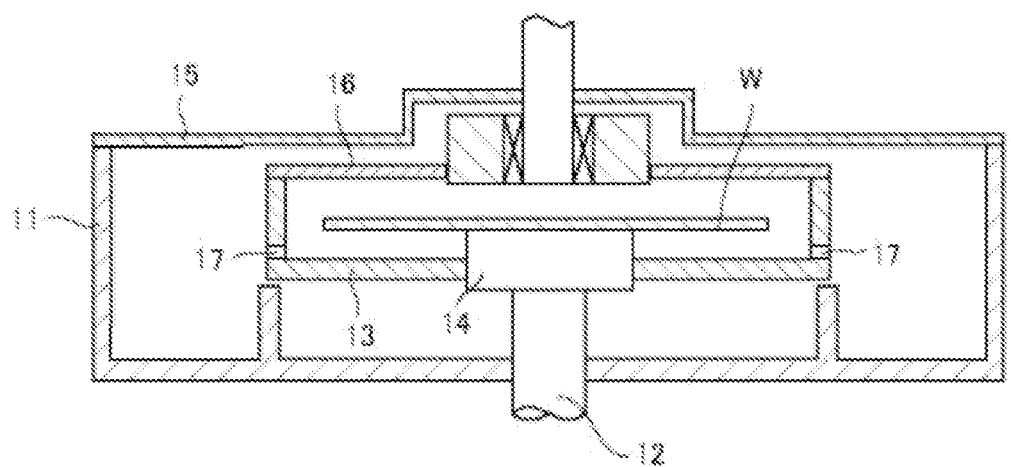
FIG. 1 is a cross-sectional view showing a rotary cup type coating device for the formation of an SOG film according to the present invention.

FIG. 1 is a rotary cup type coating device used for the coating method of the present invention. This coating device is arranged with an inner cup 13 rotated by a spinner 12 inside an outer cup 11. Inside the inner cup 13, a chuck 14 to fix a board W is arranged, and the upper surfaces of the outer cup 11 and the inner cup 13 can be closed by lids 15 and 16, respectively. The inner cup 13 is formed with an exhaust hole 17.

When the outer cup and the inner cup are kept airtight by using the lids 15 and 16, the cups may be completely kept airtight or not completely kept airtight. FIG. 1 is a non-complete airtight type provided with the exhaust hole 17. The complete airtight type is not provided with the exhaust hole 17, and reduces an effect of the airflow onto the board by rotation, and is a rotary cup type coating device in which a centrifugal force operates mainly by rotation.

Figure 2A:
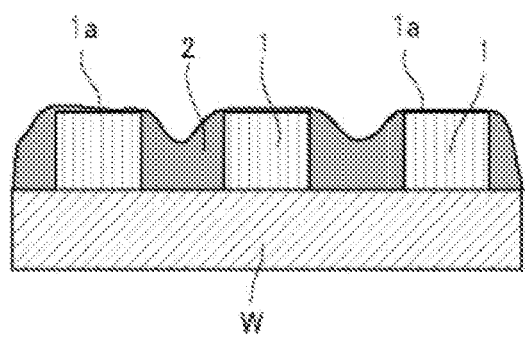
FIGS. 2A and 2B are cross-sectional views of a wiring board applied with the planarizing coating method of the present invention.
Figure 2B:
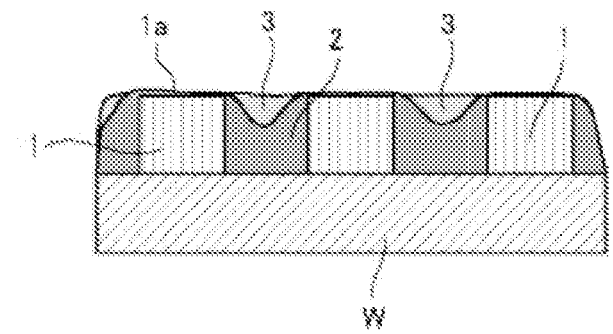
Figure 4A:
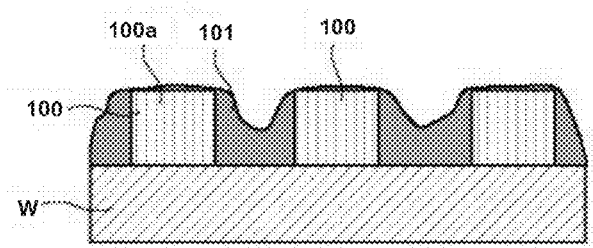
FIGS. 4A and 4B are cross-sectional views of the wiring board showing one example of a conventional planarizing coating method.
Figure 4B:
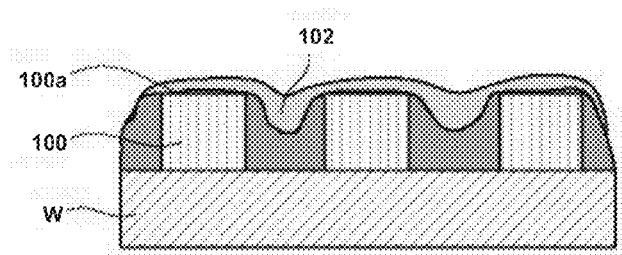

FIGS. 2A and 2B are cross-sectional views of the wiring board executed with the planarizing coating method of the present invention by using the rotary cup type coating device. On the board W, a plurality of wiring patterns 1 are formed, and the gaps of these patterns are in the form of steps. The board W having these steps is subjected to rotary coating and dry processing using a coating liquid high in non-volatile matter density, thereby obtaining a coating film 2 having a rough thickness as shown in FIG. 2A. The processing up to this stage is approximately the same as the conventional art as shown in FIG. 4A, and the crest 1a of the wiring pattern 1 is hardly adhered with a coating film.

Next, as shown in FIG. 2B, a filling processing of the recesses left over in the steps is performed using the coating liquid low in non-volatile matter density. In this case, the low density coating liquid does not remain on the crest 1a, but drifts toward the lower step so as to form a coating film 3.

Although there is no limit imposed on the types of the coating films formed by the coating method of the present invention, as a preferable example, an SOG film can be cited. The high density coating liquid is preferably 10 to 15 percent by mass in non-volatile matter density, and the low density coating liquid is preferably 1 to 8 percent by mass in non-volatile matter density. When these SOG (spin-on glass) based silica based materials are used, the formation of the planarizing insulating film as shown in FIG. 2B can be easily performed by using the rotary cup type coating device by the spin coat method, and this is preferable.

Figure 3:
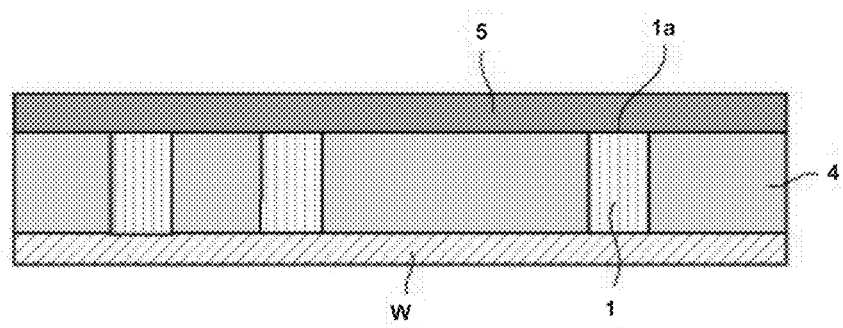
FIG. 3 is a cross-sectional view showing one example of the wiring board formed by the planarizing coating method according to the present invention.

FIG. 3 is a cross-sectional view showing one example of the wiring board formed by the planarizing coating method of the present invention. The steps formed by the wiring patterns 1 provided on the board W are planarized by a multilayer SOG film 4 which is integrated with the coating film from the high density coating liquid and the coating film from the low density coating liquid. Moreover, since the crest 1a of the wiring pattern 1 is hardly adhered with any coating film, there is no need to perform the polishing by the conventional CMP, and an interlayer insulating film 5 can be formed by plasma CVD.

Hereinafter, a detailed example and a comparison example will be shown.

EXAMPLE 1

A board provided with a plurality of wiring patterns of 550 nm in height (step) and 180 nm in intervals was used, and this board was mounted on the same rotary cup type coating device as shown in FIG. 1, and a planarizing processing by a coating liquid was performed. As a first liquid, an SOG coating liquid of 12 percent by mass in non-volatile matter density, and as a second liquid, an SOG coating liquid in which the first liquid was diluted by solution to 6 percent by mass in non-volatile matter density were used. The processing condition in the case of the first liquid was that the coating was made at a revolution speed of 500 rpm, and was baked at 80° C.→150° C.→200° C. (for a total of three minutes). The obtained coating film was approximately 400 nm in thickness.

Next, the second liquid was coated and baked by the same condition as the first liquid. As a result, the crest of the wiring pattern had hardly any coating film, and the difference between the highest portion and the lowest portion was mere 9 nm.

COMPARISON EXAMPLE 1

Except that a second coating also used the first liquid in place of the second liquid, the flattening processing was performed similarly to the first embodiment. As a result, since the crest of the wiring pattern was thickly adhered with the coating film, the difference between the highest portion and the lowest portion of the coating film was 25 nm.

The planarizing coating method of the present invention can effectively flatten the surface of the semiconductor wafer and the glass board, and therefore, the method can be used when the SOG liquid, the photo-resist liquid or the coating liquid for color filters are coated.

Although there have been described what are the present embodiments of the invention, it will be understood that variations and modifications may be made thereto within the scope of the claims appended hereto.

What is claimed is:

1. A planarizing coating method for filling a step between patterns formed on a board surface, comprising the steps of:
   preparing at least two types of coating liquids different in non-volatile matter densities;
   first coating one of the coating liquids higher in non-volatile matter density on the board surface;
   rotating the board by a first amount so as to leave the one coating liquid inside the step and such that, at the same time, substantially none of the one coating liquid is left on a pattern crest of the patterns;
   subsequently coating another of the coating liquids lower in non-volatile matter density on the board surface; and
   rotating the board by a second amount so that the coating liquid lower in density is left on a coating film comprising the one coating liquid higher in density and such that, at the same time, substantially none of the other coating liquid lower in density is left on the pattern crest;
   wherein the method step of the rotating the board by the second amount is operable to produce an evenly substantially flat top surface on the board such that the substantially flat top surface is substantially aligned with the pattern crest.

2. A planarizing coating method for filling a step between patterns formed on a board surface, comprising the steps of:
   preparing at least two types of coating liquids different in non-volatile matter densities;
   first coating one of the coating liquids lower in non-volatile matter density on the board surface;
   rotating the board by a first amount so as to leave the coating liquid inside the step and such that, at the same time, substantially none of the one coating liquid is left on a pattern crest of the patterns;
   subsequently coating another of the coating liquids higher in non-volatile matter density on the board surface; and
   rotating the board by a second amount so that the coating liquid higher in density is left on a coating film comprising the one coating liquid lower in density left inside the step and such that, at the same time, substantially none of the other coating liquid higher in density is left on the pattern crest;
   wherein the method step of rotating the board by the second amount is operable to produce an evenly substantially flat top surface on the board such that the substantially flat top surface is substantially aligned with the pattern crest.

3. The planarizing coating method according to claim 1, wherein the rotating steps involve
   setting the board inside a cup of a rotary cup type coating device,
   closing an upper surface of the cup by a lid of the coating device, and
   rotating the cup so that the inside of the cup is put into an under-pressurized state.

4. The planarizing coating method according to claim 3, wherein said cup upper surface is completely kept airtight and closed by the lid during the rotating steps.

5. The planarizing coating method according to claim 2, wherein the rotating steps involve
   setting the board inside a cup of a rotary cup type coating device,
   closing an upper surface of the cup by a lid of the coating device, and
   rotating the cup so that the inside of the cup is put into an under-pressurized state.

6. The planarizing coating method according to claim 5, wherein said cup upper surface is completely kept airtight and closed by the lid during the rotating steps.

7. The planarizing coating method according to claim 1, further comprising the step of baking the one coating liquid higher in density as coated on the board surface prior to the step of coating the other coating liquid lower in density on the board surface.

8. The planarizing coating method according to claim 1, wherein said coating liquids comprise at least one of a spin-on-glass liquid, a photoresist liquid, and a coating liquid for color filters.

9. The planarizing coating method according to claim 1, wherein said other coating liquid lower in density is a diluted version of the one coating liquid higher in density.

10. The planarizing coating method according to claim 2, further comprising the step of baking the one coating liquid lower in density as coated on the board surface prior to the step of coating the other coating liquid higher in density on the board surface.

11. The planarizing coating method according to claim 2, wherein said coating liquids comprise at least one of a spin-on-glass liquid, a photoresist liquid, and a coating liquid for color filters.

12. The planarizing coating method according to claim 2, wherein said one coating liquid lower in density is a diluted version of the other coating liquid higher in density.

13. The planarizing coating method according to claim 1, wherein said one of the coating liquids higher in non-volatile matter density includes 10 to 15 percent by mass in non-volatile matter density; and said other of the liquids lower in non-volatile density includes 1 to 8 percent by mass in non-volatile matter density.

14. The planarizing coating method according to claim 1, further comprising the steps of baking the one coating liquid higher in density as coated on the board surface stepwise at 80° C. then 150° C. then 200° C. for a total period of three minutes prior to the step of coating the other coating liquid lower in density on the board surface; and baking the one coating liquid lower in density as coated on the board surface stepwise at 80° C. then 150° C. then 200° C. for a total period of three minutes;

wherein upon completion of the step of baking the one coating liquid lower in density, the difference between a highest portion and a lowest portion of the coated surface on the board is about 9 nm.

* * * * *